US011442363B2

(12) United States Patent
Kim et al.

(10) Patent No.: US 11,442,363 B2
(45) Date of Patent: Sep. 13, 2022

(54) APPARATUS FOR TREATING SUBSTRATE

(71) Applicant: SEMES CO., LTD., Cheonan-si (KR)

(72) Inventors: Daesung Kim, Suwon-si (KR); Eunwoo Park, Gyeongsan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 43 days.

(21) Appl. No.: 16/896,538

(22) Filed: Jun. 9, 2020

(65) Prior Publication Data
US 2020/0393766 A1  Dec. 17, 2020

(30) Foreign Application Priority Data

Jun. 11, 2019 (KR) .................. 10-2019-0068587

(51) Int. Cl.
*G03F 7/16* (2006.01)
*B05C 5/00* (2006.01)
*B05B 13/02* (2006.01)

(52) U.S. Cl.
CPC .............. *G03F 7/162* (2013.01); *B05B 13/02* (2013.01); *B05C 5/001* (2013.01)

(58) Field of Classification Search
USPC ..... 118/52, 612, 319, 320, 56, 666, 667, 58, 118/69
See application file for complete search history.

(56) References Cited

U.S. PATENT DOCUMENTS 5,578,127 A * 11/1996 Kimura .................. G03F 7/16
  118/695
5,670,041 A * 9/1997 Cho ..................... C02F 1/487
  210/222

(Continued)

FOREIGN PATENT DOCUMENTS

JP  S63-081267 U  5/1988
JP  2002-361156 A  12/2002

(Continued)

OTHER PUBLICATIONS

English Translation KR-20170026821A (Year: 2017).*

(Continued)

*Primary Examiner* — Yewebdar T Tadesse
(74) *Attorney, Agent, or Firm* — Harness, Dickey & Pierce, P.L.C.

(57) ABSTRACT

An apparatus for treating a substrate includes a treatment vessel having a treatment space therein, a substrate support unit that supports the substrate in the treatment space, and a liquid dispensing unit that dispenses a treatment liquid onto the substrate placed on the substrate support unit. The liquid dispensing unit includes a treatment liquid tube through which the treatment liquid flows, a constant-temperature water tube through which constant-temperature water flows and that surrounds the treatment liquid tube, wherein the constant-temperature water maintains the treatment liquid, which flows through the treatment liquid tube, at a set temperature, a constant-temperature water supply tube that supplies the constant-temperature water to the constant-temperature water tube, and an activation member that is installed in the constant-temperature water supply tube and that activates ions in the constant-temperature water.

17 Claims, 8 Drawing Sheets

(56) References Cited

U.S. PATENT DOCUMENTS

2009/0308735 A1\* 12/2009 Jo ............................. C02F 1/48
                                                              204/196.02
2016/0046515 A1\* 2/2016 Nishida .................. C02F 1/441
                                                              210/701

FOREIGN PATENT DOCUMENTS

| KR | 10-2001-0056088 A | 7/2001 |
| KR | 10-2004-0059465 A | 7/2004 |
| KR | 10-2009-0070665 A | 7/2009 |
| KR | 101326144 B1 | 11/2013 |
| KR | 10-2016-0078582 A | 7/2016 |
| KR | 10-2017-0026821 A | 3/2017 |
| KR | 10-2018-0091977 A | 8/2018 |

OTHER PUBLICATIONS

Korean Office Action dated Jul. 29, 2020 issued in corresponding Korean Appln. No. 10-2019-0068587.
Korean Notice of Allowance dated Apr. 22, 2021 issued in corresponding Korean Appln. No. 10-2019-0068587.

\* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2019-0068587 filed on Jun. 11, 2019, in the Korean Intellectual Property Office, the entire contents of which are hereby incorporated by reference.

BACKGROUND

Embodiments of the inventive concept described herein relate to an apparatus for treating a substrate using a liquid, and more particularly, relate to an apparatus for dispensing a liquid onto a substrate.

Various processes are performed on a substrate to manufacture semiconductor elements. Among the various processes, a photolithography process of forming a pattern on the substrate is included in essential processes. The photolithography process includes a coating process of coating the substrate with a light-sensitive liquid such as photoresist, an exposing process of forming a pattern by exposing the light-sensitive liquid on the substrate to light, and a developing process of developing the pattern.

It is very important to apply the light-sensitive liquid to a uniform thickness or a set thickness in the coating process, and the thickness and uniformity are greatly affected by temperature. Accordingly, a constant-temperature water tube for uniformly maintaining or adjusting the temperature of the light-sensitive liquid is provided to surround a light-sensitive liquid supply line through which the light-sensitive liquid is supplied.

In general, pure water is used as the constant-temperature water for cost savings and stability. However, the pure water has a fatal disadvantage of corroding a metal tube, and the corrosion of the metal tube leads to leakage of the constant-temperature water, which causes contamination of the light-sensitive liquid and surrounding devices.

SUMMARY

Embodiments of the inventive concept provide an apparatus for uniformly maintaining and adjusting the temperature of a liquid.

Furthermore, embodiments of the inventive concept provide an apparatus for preventing a tube from being corroded.

Embodiments of the inventive concept provide an apparatus for preventing a surrounding environment from being contaminated due to water leakage caused by corrosion of a tube.

According to an exemplary embodiment, an apparatus for treating a substrate includes a treatment vessel having a treatment space therein, a substrate support unit that supports the substrate in the treatment space, and a liquid dispensing unit that dispenses a treatment liquid onto the substrate placed on the substrate support unit. The liquid dispensing unit includes a treatment liquid tube through which the treatment liquid flows, a constant-temperature water tube through which constant-temperature water flows and that surrounds the treatment liquid tube, wherein the constant-temperature water maintains the treatment liquid, which flows through the treatment liquid tube, at a set temperature, a constant-temperature water supply tube that supplies the constant-temperature water to the constant-temperature water tube, and an activation member that is installed in the constant-temperature water supply tube and that activates ions in the constant-temperature water.

The constant-temperature water supply tube may include an upstream-side supply tube that connects a constant-temperature water source and the activation member and a downstream-side supply tube that connects the constant-temperature water tube and the activation member. The activation member may be detachable from the upstream-side supply tube and the downstream-side supply tube. The activation member may include a metal tube and an organic tube disposed adjacent to the metal tube.

The organic tube may include a first organic tube that connects the upstream-side supply tube and one end of the metal tube and a second organic tube that connects the downstream-side supply tube and an opposite end of the metal tube. Each of the first organic tube and the second organic tube may have a plurality of fluid channels formed therein in which the constant-temperature water flows. The organic tube may have a plurality of fluid channels formed therein in which the constant-temperature water flows, and the metal tube may have a single fluid channel formed therein, which is connected with the fluid channels.

The metal tube may be formed of a material containing zinc, and each of the first organic tube and the second organic tube may be formed of a material containing carbon.

The liquid dispensing unit further may include a manifold that connects the constant-temperature water tube and the constant-temperature water supply tube and a constant-temperature water collection tube that collects the constant-temperature water from the manifold into the constant-temperature water source. The activation member may be additionally installed in the constant-temperature water collection tube.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
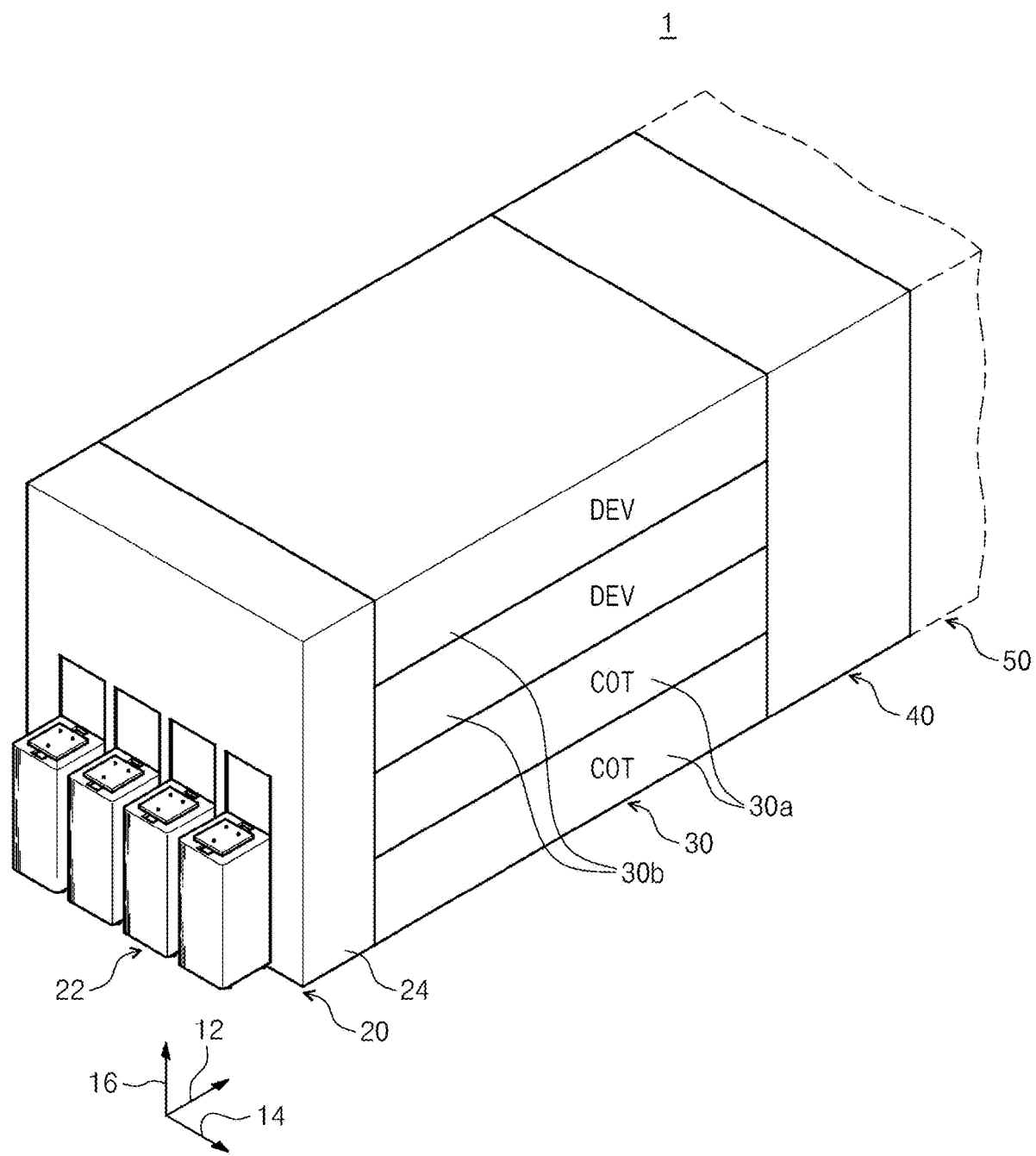
FIG. 1 is a schematic perspective view illustrating a substrate treating apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

Figure 2:
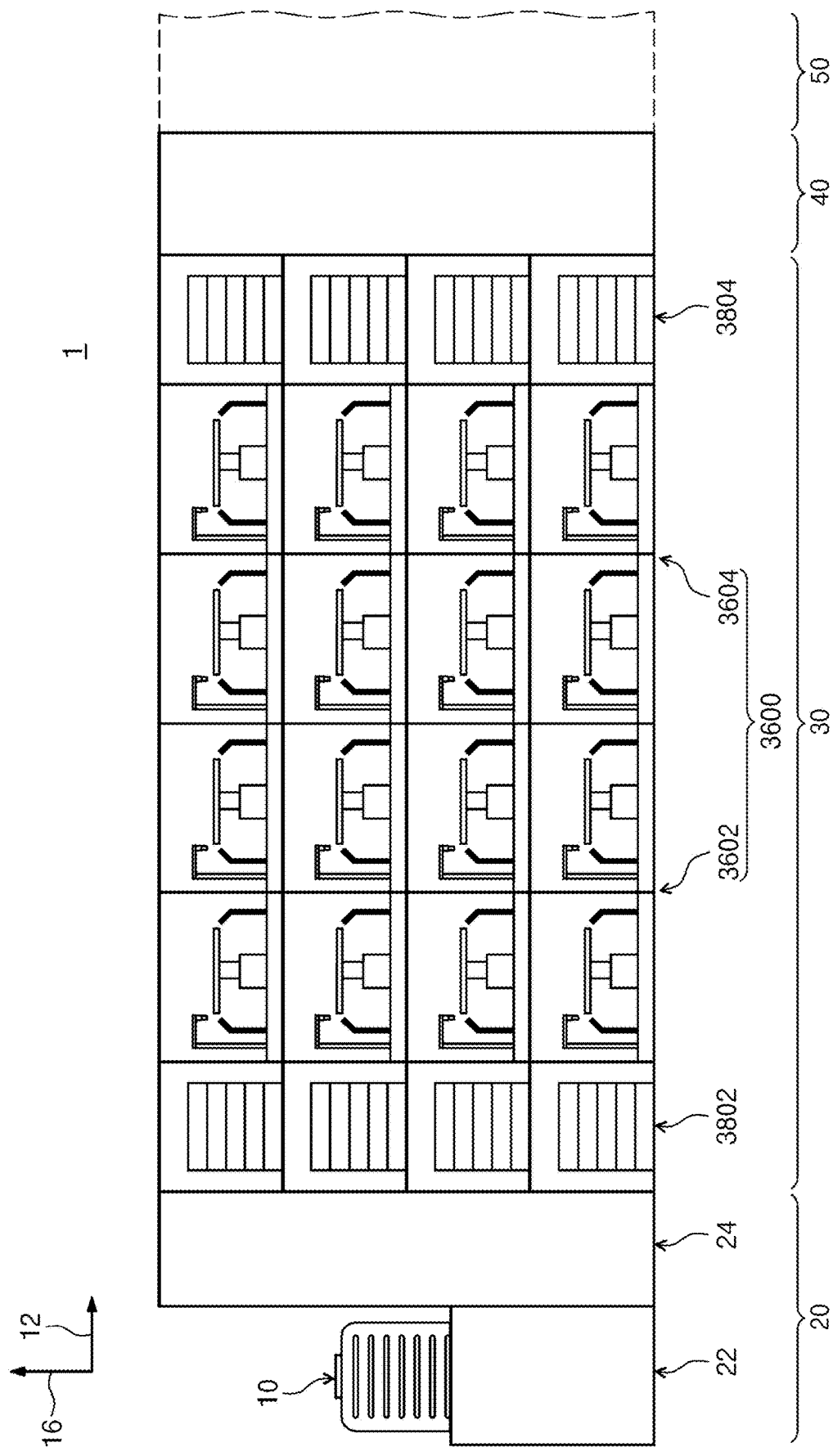
FIG. 2 is a sectional view illustrating coating blocks and developing blocks of the substrate treating apparatus of FIG. 1.
Figure 3:
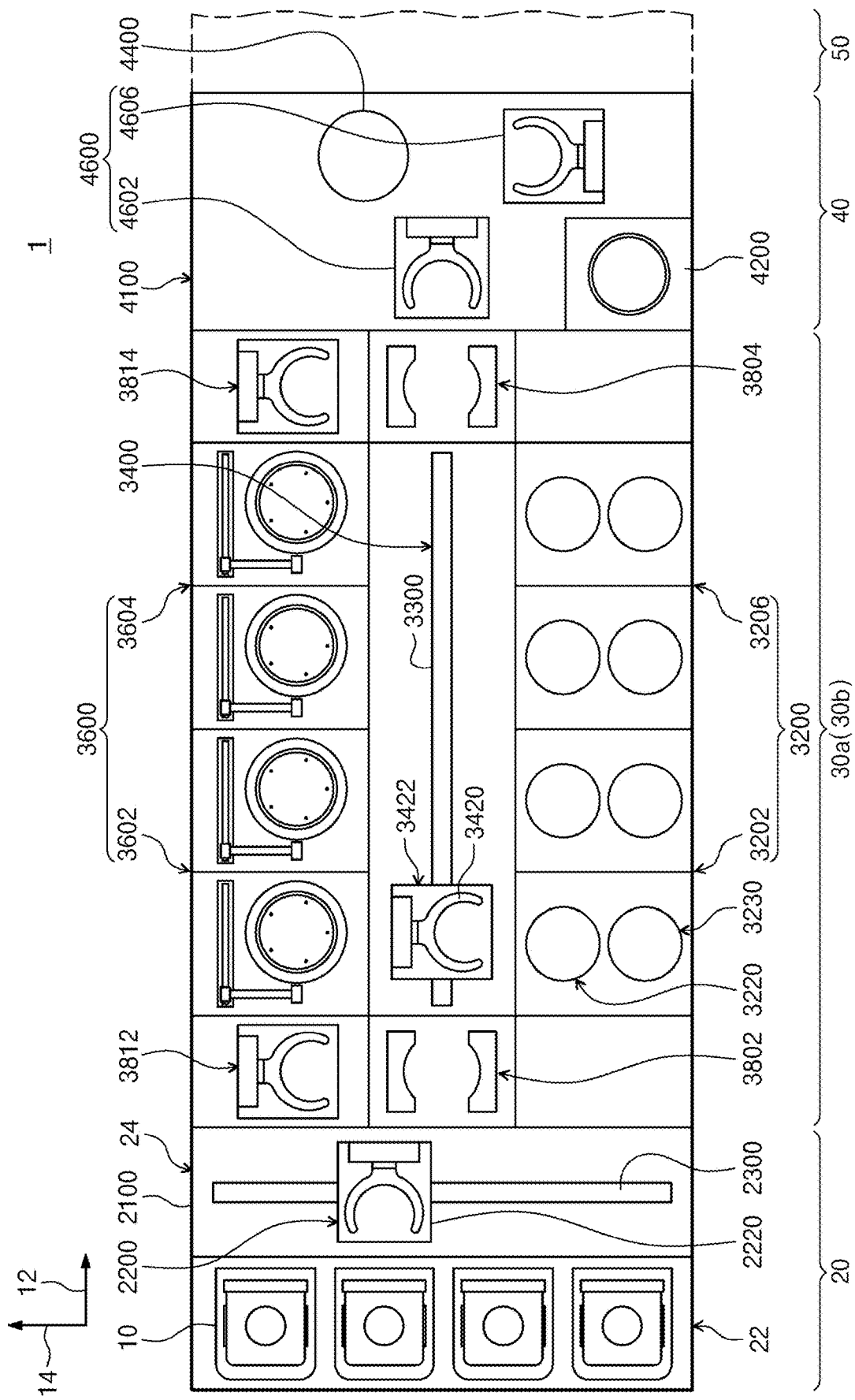
FIG. 3 is a plan view illustrating the substrate treating apparatus of FIG. 1.

FIG. 1 is a schematic perspective view illustrating a substrate treating apparatus according to an embodiment of the inventive concept. FIG. 2 is a sectional view illustrating coating blocks and developing blocks of the substrate treating apparatus of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W from carriers 10 having the substrates W received therein to the treating module 30 and places the completely treated substrates W in the carriers 10. The lengthwise direction of the index module 20 is parallel to the second direction 14. The index module 20 has load ports 22 and an index frame 24. The load ports 22 are located on the opposite side to the treating module 30 with respect to the index frame 24. The carriers 10 having the substrates W received therein are placed on the load ports 22. The load ports 22 may be disposed along the second direction 14.

Airtight carriers 10 such as front open unified pods (FOUPs) may be used as the carriers 10. The carriers 10 may be placed on the load ports 22 by a transfer unit (not illustrated) such as an overhead transfer, an overhead conveyor, or an automatic guided vehicle, or by an operator.

An index robot 2200 is provided in the index frame 24. A guide rail 2300, the lengthwise direction of which is parallel to the second direction 14, is provided in the index frame 24, and the index robot 2200 is movable on the guide rail 2300. The index robot 2200 includes a hand 2220 on which the substrate W is placed, and the hand 2220 is movable forward and backward, rotatable about an axis facing in the third direction 16, and movable along the third direction 16.

The treating module 30 performs a coating process and a developing process on the substrate W. The treating module 30 has the coating blocks 30a and the developing blocks 30b. The coating blocks 30a perform the coating process on the substrate W, and the developing blocks 30b perform the developing process on the substrate W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 3, the coating blocks 30a have a heat treatment chamber 3200, a transfer chamber 3400, a liquid treatment chamber 3600, and a buffer chamber 3800. The heat treatment chamber 3200 performs a heat treatment process on the substrate W. The heat treatment process may include a cooling process and a heating process. The liquid treatment chamber 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the liquid treatment chamber 3600 in the coating blocks 30a.

The lengthwise direction of the transfer chamber 3400 is parallel to the first direction 12. A transfer robot 3422 is provided in the transfer chamber 3400. The transfer robot 3422 transfers the substrate W between the heat treatment chamber 3200, the liquid treatment chamber 3600, and the buffer chamber 3800. According to an embodiment, the transfer robot 3422 has a hand 3420 on which the substrate W is placed, and the hand 3420 is movable forward and backward, rotatable about an axis facing in the third direction 16, and movable along the third direction 16. A guide rail 3300, the lengthwise direction of which is parallel to the first direction 12, is provided in the transfer chamber 3400, and the transfer robot 3422 is movable on the guide rail 3300.

Figure 4:
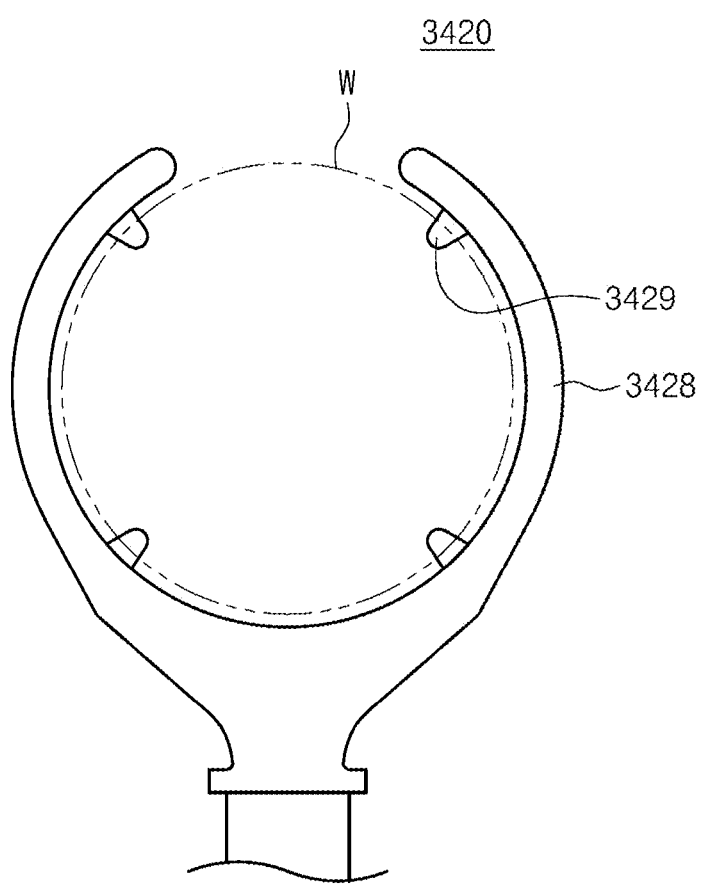
FIG. 4 is a view illustrating one example of a hand of a transfer robot of FIG. 3.

FIG. 4 is a view illustrating one example of the hand of the transfer robot of FIG. 3. Referring to FIG. 4, the hand 3420 has a base 3428 and support protrusions 3429. The base 3428 may have an annular ring shape, the circumference of which is partly curved. The base 3428 has an inner diameter larger than the diameter of the substrate W. The support protrusions 3429 extend inward from the base 3428. The support protrusions 3429 support an edge region of the substrate W. According to an embodiment, four support protrusions 3429 may be provided at equal intervals.

A plurality of heat treatment chambers 3202 are provided. The heat treatment chambers 3202 are disposed side by side along the first direction 12. The heat treatment chambers 3202 are located on one side of the transfer chamber 3400.

Figure 5:
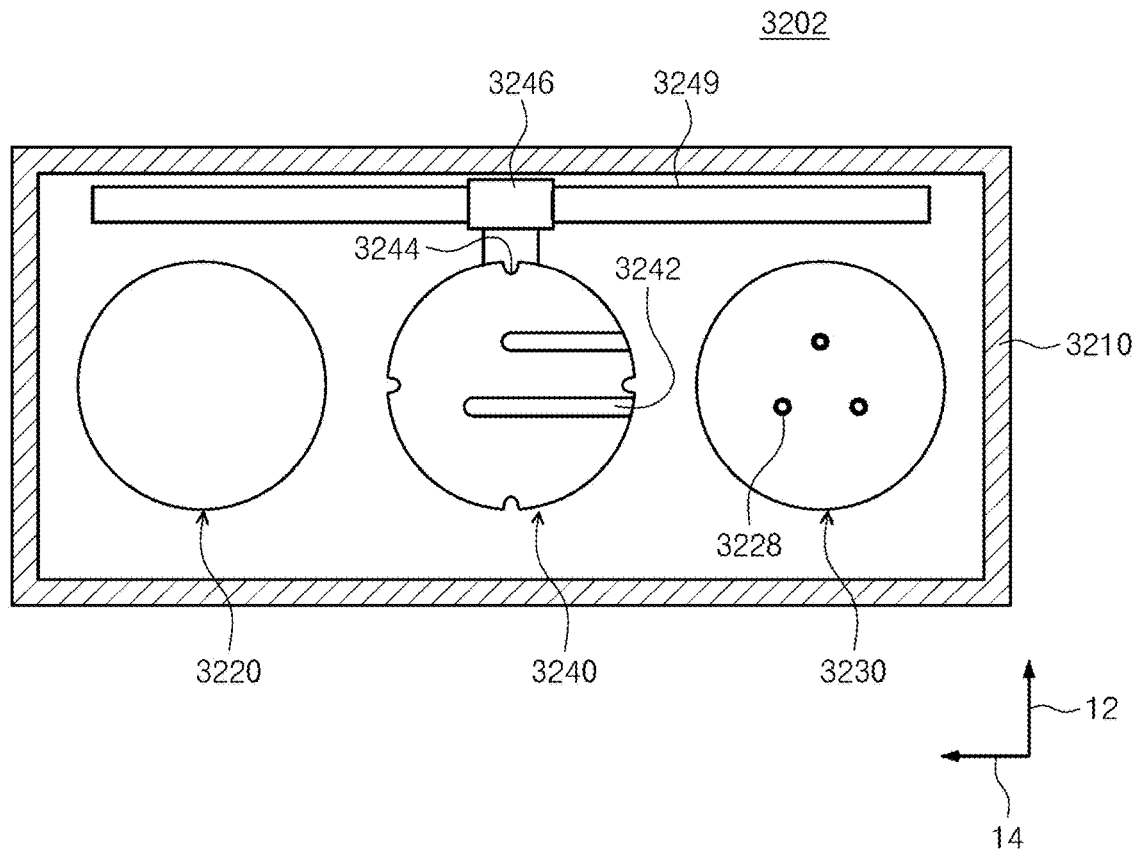
FIG. 5 is a schematic plan view illustrating one example of a heat treatment chamber of FIG. 3.
Figure 6:
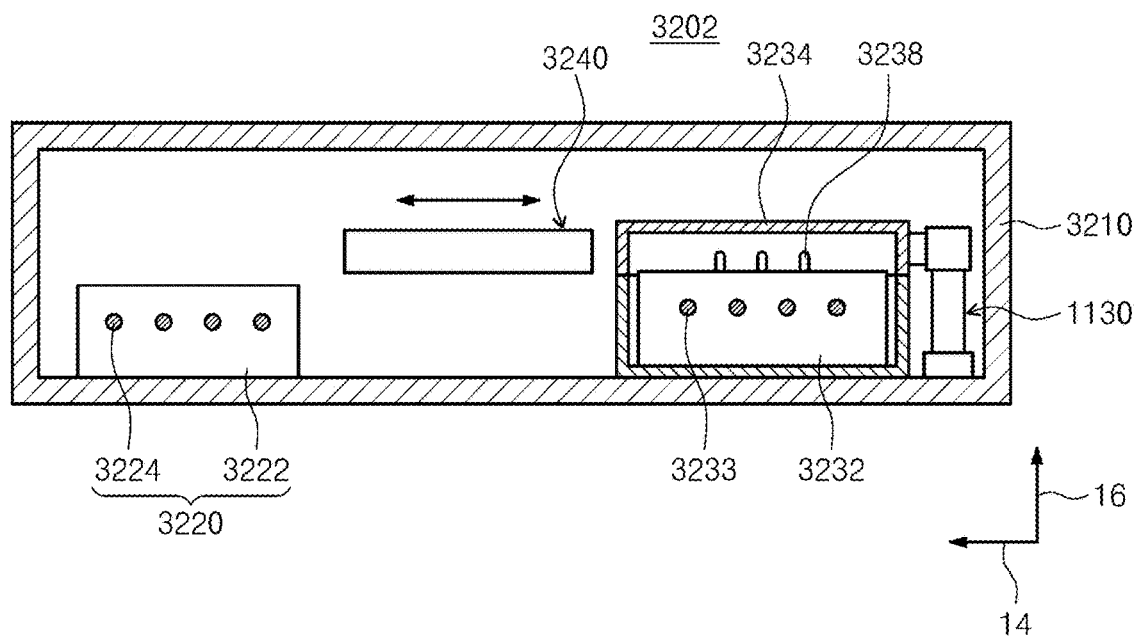
FIG. 6 is a front view of the heat treatment chamber of FIG. 5.

FIG. 5 is a schematic plan view illustrating one example of the heat treatment chamber of FIG. 3, and FIG. 6 is a front view of the heat treatment chamber of FIG. 5. Referring to FIGS. 5 and 6, the heat treatment chamber 3202 has a housing 3210, a cooling unit 3220, a heating unit 3230, and a transfer plate 3240.

The housing 3210 has a substantially rectangular parallelepiped shape. The housing 3210 has, in a sidewall thereof, an entrance/exit opening (not illustrated) through which the substrate W enters and exits the housing 3210. The entrance/exit opening may be maintained in an open state. Selectively, a door (not illustrated) may be provided to open and close the entrance/exit opening. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. A cooling member 3224 is provided inside the cooling plate 3222. According to an embodiment, the cooling member 3224 may be formed inside the cooling plate 3222 and may serve as a fluid channel through which a cooling fluid flows.

The heating unit 3230 has a heating plate 3232, a cover 3234, and a heater 3233. The heating plate 323 has a substantially circular shape when viewed from above. The heating plate 3232 has a larger diameter than the substrate W. The heating plate 3232 is equipped with the heater 3233. The heater 3233 may be a resistance heating element to which electric current is applied. The heating plate 3232 has lift pins 3238 that are vertically movable along the third direction 16. The lift pins 3238 receive the substrate W from a transfer unit outside the heating unit 3230 and lay the substrate W down on the heating plate 3232, or raise the substrate W off the heating plate 3232 and transfer the substrate W to the transfer unit outside the heating unit 3230. According to an embodiment, three lift pins 3238 may be provided. The cover 3234 has a space therein, which is open at the bottom. The cover 3234 is located over the heating plate 3232 and is vertically moved by an actuator 3236. When the cover 3234 is brought into contact with the heating plate 3232, a space surrounded by the cover 3234 and the heating plate 3232 serves as a heating space in which the substrate W is heated.

The transfer plate 3240 has a substantially circular plate shape and has a diameter corresponding to that of the substrate W. The transfer plate 3240 has notches 3244 formed at the edge thereof. The notches 3244 may have a shape corresponding to the protrusions 3429 formed on the hand 3420 of the transfer robot 3422 described above. Furthermore, as many notches 3244 as the protrusions 3429 formed on the hand 3420 are formed in positions corresponding to the protrusions 3429. The substrate W is transferred between the hand 3420 and the transfer plate 3240 when the vertical positions of the hand 3420 and the transfer plate 3240 aligned with each other in the vertical direction are changed. The transfer plate 3240 may be mounted on a guide rail 3249 and may be moved along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the second direction 14, and the guide grooves 3242 are located to be spaced apart from each other along the first direction 12. The guide grooves 3242 prevent the transfer plate 3240 and the lift pins 1340 from interfering with each other when the substrate W is transferred between the transfer plate 3240 and the heating unit 3230.

The substrate W is heated while the substrate W is directly placed on the heating plate 3232. The substrate W is cooled while the transfer plate 3240 on which the substrate W is placed is brought into contact with the cooling plate 3222. The transfer plate 3240 is formed of a material having a high heat transfer rate for efficient heat transfer between the cooling plate 3222 and the substrate W. According to an embodiment, the transfer plate 3240 may be formed of a metallic material.

The heating units 3230 provided in some of the heat treatment chambers 3200 may improve adhesion of photoresist to the substrate W by supplying gas while heating the substrate W. According to an embodiment, the gas may be a hexamethyldisilane gas.

A plurality of liquid treatment chambers 3600 are provided. Some of the liquid treatment chambers 3600 may be stacked on each other. The liquid treatment chambers 3600 are disposed on an opposite side of the transfer chamber 3400. The liquid treatment chambers 3600 are arranged side by side along the first direction 12. Some of the liquid treatment chambers 3600 are located adjacent to the index module 20. Hereinafter, these liquid treatment chambers are referred to as the front liquid treatment chambers 3602. Other liquid treatment chambers 3600 are located adjacent to the interface module 40. Hereinafter, these liquid treatment chambers are referred to as the rear liquid treatment chambers 3604.

The front liquid treatment chambers 3602 apply a first liquid to the substrate W, and the rear liquid treatment chambers 3604 apply a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Figure 7:
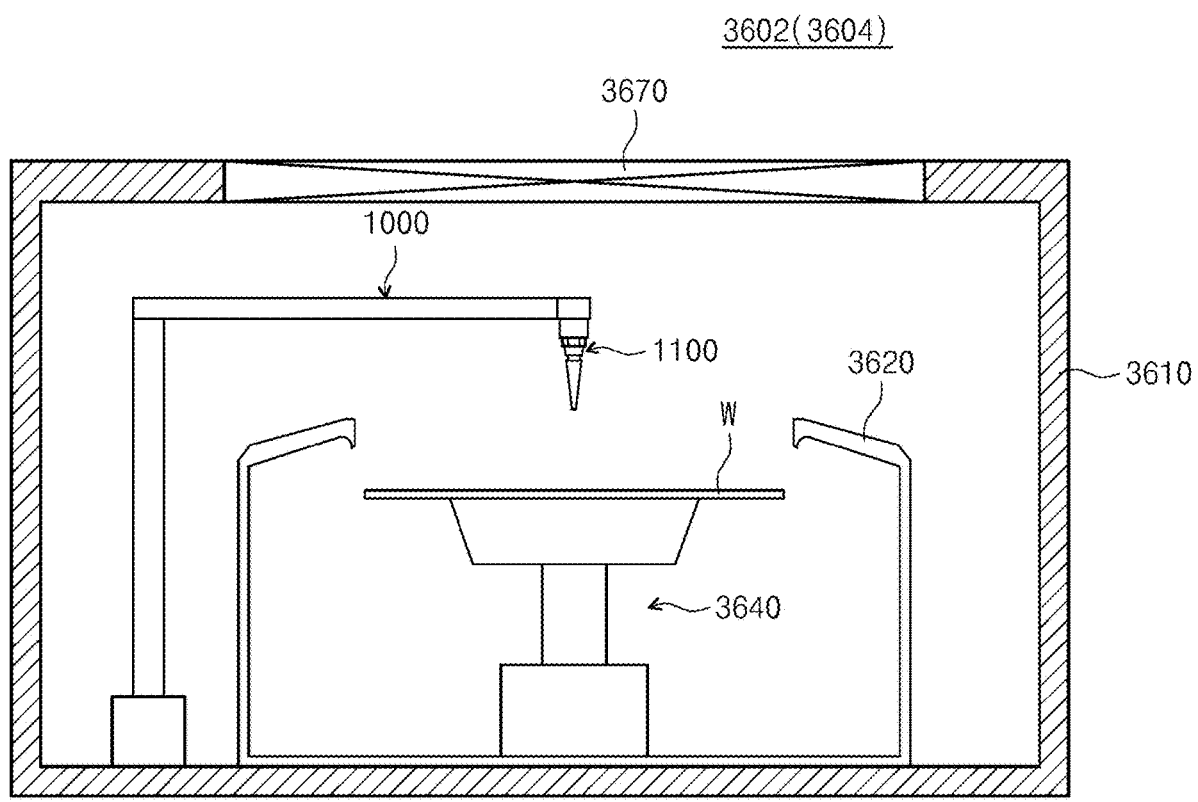
FIG. 7 is a schematic view illustrating one example of a liquid treatment chamber of FIG. 3.

FIG. 7 is a schematic view illustrating one example of the liquid treatment chamber of FIG. 3. Referring to FIG. 7, the liquid treatment chamber 3600 has a housing 3610, a cup 3620, a substrate support unit 3640, and a liquid dispensing unit 1000. The housing 3610 has a substantially rectangular parallelepiped shape. The housing 3610 has, in a sidewall thereof, an entrance/exit opening (not illustrated) through which the substrate W enters and exits the housing 3610. The entrance/exit opening may be opened and closed by a door (not illustrated). The cup 3620, the substrate support unit 3640, and the liquid dispensing unit 1000 are provided in the housing 3610. A fan filter unit 3670 for forming a downward air flow in the housing 3260 may be provided in an upper wall of the housing 3610. The cup 3620 has a treatment space that is open at the top. The substrate support unit 3640 is disposed in the treatment space and supports the substrate W. The substrate support unit 3640 is provided such that the substrate W is rotatable during liquid treatment. The liquid dispensing unit 1000 dispenses a liquid onto the substrate W supported on the substrate support unit 3640.

Figure 8:
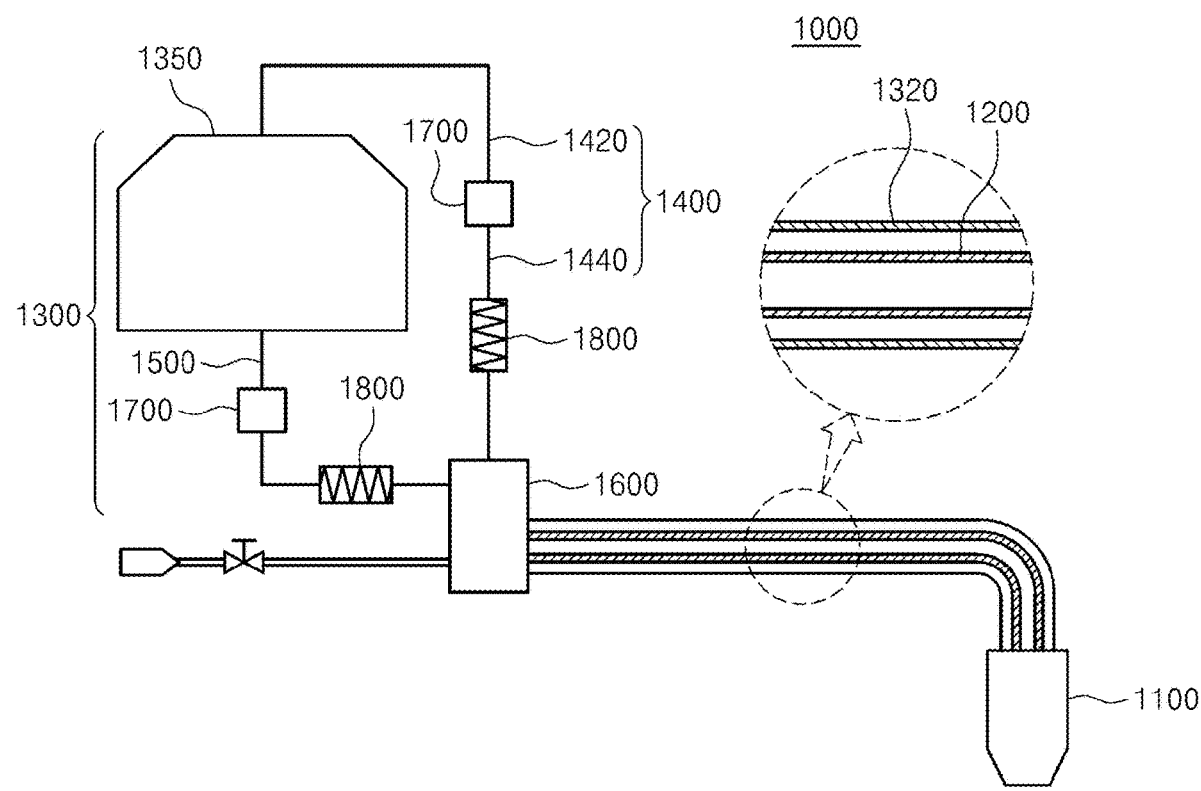
FIG. 8 is a view illustrating a liquid dispensing unit of FIG. 7.

FIG. 8 is a sectional view illustrating the liquid dispensing unit of FIG. 7. Referring to FIGS. 7 and 8, the liquid dispensing unit 1000 includes a nozzle 1100, a treatment liquid tube 1200, and a temperature adjustment member 1300. The nozzle 1100 dispenses the liquid onto the substrate W in a process position in which the nozzle 1100 faces the substrate W supported on the substrate support unit 3640. For example, the liquid may be a light-sensitive liquid such as photoresist. The process position may be a position in which the nozzle 1100 is able to dispense the light-sensitive liquid to the center of the substrate W.

The treatment liquid tube 1200 supplies the light-sensitive liquid to the nozzle 1100. The treatment liquid tube 1200, through which the light-sensitive liquid flows, is equipped with various devices such as an opening/shutting valve, a suck-back valve, and a pump. The opening/shutting valve is a valve for opening/closing the treatment liquid tube 1200, and the suck-back valve is a valve for adjusting the level of the light-sensitive liquid located at a dispensing end of the nozzle 1100. The pump applies pressure to the inside of the treatment liquid tube 1200 to supply the light-sensitive liquid.

The temperature adjustment member 1300 adjusts the temperature of the light-sensitive liquid flowing through the treatment liquid tube 1200. The temperature adjustment member 1300 allows temperature-adjusted constant-temperature water to flow around the treatment liquid tube 1200, thereby adjusting the temperature of the light-sensitive liquid. The temperature adjustment member 1300 includes a constant-temperature water tube 1320, a constant-temperature water supply tube 1400, a constant-temperature water collection tube 1500, a manifold 1600, and activation members 1700. The constant-temperature water tube 1320 surrounds the treatment liquid tube 1200. The constant-temperature water tube 1320 may surround the treatment liquid tube 1200 from one end of the treatment liquid tube 1200 to an opposite end thereof. Alternatively, the constant-temperature water tube 1320 may surround only a partial area from a fastening end to which the nozzle 1100 is connected. The constant-temperature water supply tube 1400 supplies constant-temperature water to the constant-temperature water tube 1320. The constant-temperature water supply tube 1400 includes an upstream-side supply tube 1420 and a downstream-side supply tube 1440. The upstream-side supply tube 1420 connects a constant-temperature water source 1350 and the activation member 1700, and the downstream-side supply tube 1440 connects the activation member 1700 and the manifold 1600. Accordingly, constant-temperature water received in the constant-temperature water source 1350 sequentially passes through the upstream-side supply tube 1420, the activation member 1700, and the downstream-side supply tube 1440 and is supplied to the manifold 1600. The constant-temperature water collection tube 1500 collects the constant-temperature water supplied to the manifold 1600 or the constant-temperature water supplied to the constant-temperature water tube 1320. The constant-temperature water collection tube 1500 circulates the constant-temperature water by collecting the constant-temperature water supplied to the manifold 1600 or the constant-temperature water tube 1320 into the constant-temperature water source 1350. According to an embodiment, the constant-temperature water may be supplied from the constant-temperature water source 1350 and may be sequentially circulated by the manifold 1600 through the constant-temperature water supply tube 1400, the manifold 1600, the constant-temperature water tube 1320, the manifold 1600, and the constant-temperature water collection tube 1500. Alternatively, the constant-temperature water may be supplied from the constant-temperature water source 1350 and may be sequentially circulated by the manifold 1600 through the constant-temperature water supply tube 1400, the manifold 1600, and the constant-temperature water collection tube 1500. The constant-temperature water supply tube 1400 and the constant-temperature water collection tube 1500 are equipped with a heater 1800 that adjusts the temperature of the constant-temperature water to a set temperature.

The manifold 1600 adjusts a direction in which the constant-temperature water is supplied. The constant-temperature water supply tube 1400, the constant-temperature water collection tube 1500, and the constant-temperature water tube 1320 are connected to the manifold 1600. The manifold 1600 receives the constant-temperature water from the constant-temperature water supply tube 1400 and supplies the constant-temperature water to one of the constant-temperature water collection tube 1500 and the constant-temperature water tube 1320.

The activation members 1700 activate ions in the constant-temperature water. The activation members 1700 may be installed in the constant-temperature water supply tube 1400 and the constant-temperature water collection tube 1500, respectively. The activation members 1700 may activate the ions in the constant-temperature water passing through the activation members 1700, and the activated ions may remove dissolved oxygen contained in the constant-temperature water. Each of the activation members 1700 includes a metal tube 1740 and organic tubes 1720. Here, the metal tube 1740 is defined as a tube formed of a metallic material, and the organic tubes 1720 are defined as tubes formed of an organic material. According to an embodiment, the constant-temperature water supply tube 1400 and the constant-temperature water collection tube 1500, in which the activation members 1700 are installed, may be formed of a metallic material.

Figure 9:
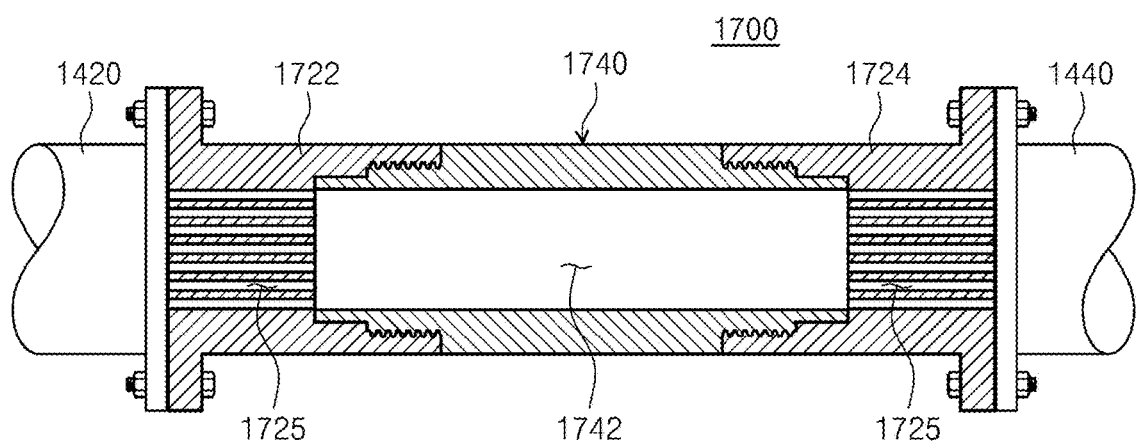
FIG. 9 is a sectional view illustrating an activation member of FIG. 8.
Figure 10:
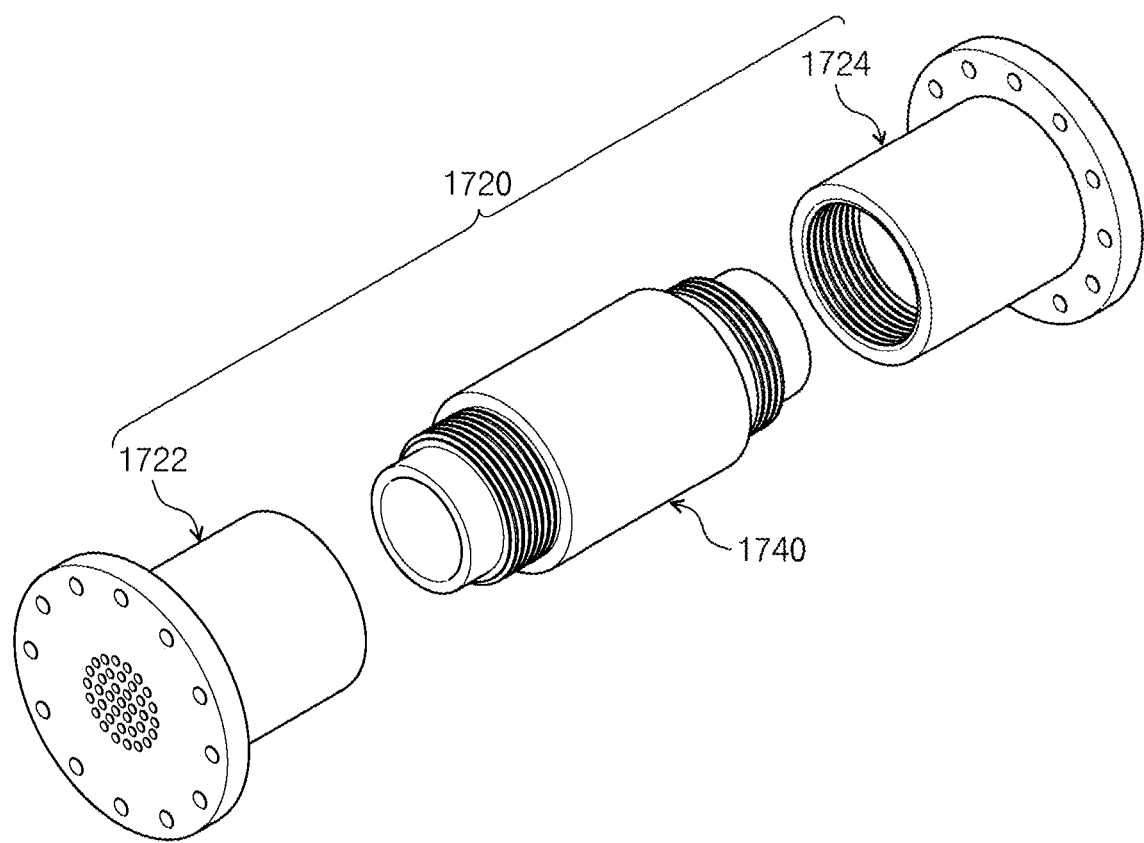
FIG. 10 is an exploded perspective view illustrating the activation member of FIG. 9.

FIG. 9 is a sectional view illustrating the activation member of FIG. 8, and FIG. 10 is an exploded perspective view illustrating the activation member of FIG. 9. Referring to FIGS. 9 and 10, the organic tubes 1720 include a first organic tube 1722 and a second organic tube 1724. The first organic tube 1722 is fastened to one end of the metal tube 1740, and the second organic tube 1724 is fastened to an opposite end of the metal tube 1740. Accordingly, the first organic tube 1722 connects the upstream-side supply tube 1420 and the metal tube 1740, and the second organic tube 1724 connects the downstream-side supply tube 1440 and the metal tube 1740. The organic tubes 1720 may be fastened to the opposite ends of the metal tube 1740 to distinguish static electricity between the metal tube 1740 and the constant-temperature water supply tube 1400 and form a stable electrostatic field.

Each of the first organic tube 1722 and the second organic tube 1724 has a plurality of fluid channels 1725 formed therein. The fluid channels 1725 increase the contact area between the constant-temperature water and the organic tubes 1720 to increase a frictional area. Due to the friction between the organic tubes 1720 and the constant-temperature water, static electricity is integrated in the organic tubes 1720 and the metal tube 1740. Positive charges are integrated in the organic tubes 1720, negative charges are integrated in the metal tube 1740, and an electrostatic field is formed between the organic tubes 1720 and the metal tube 1740. Accordingly, the electrostatic field rotating about an axis facing in the direction in which the constant-temperature water flows is formed, and ions in the constant-temperature water are activated while the constant-temperature water passes through the electrostatic field. For example, the constant-temperature water may be pure water ($H_2O$), and hydrogen ions ($H^+$) and hydroxyl ions ($OH^-$) may be activated. The organic tubes 1720 may be formed of a material containing carbon (C).

The metal tube 1740 is located between the first organic tube 1722 and the second organic tube 1724. The metal tube 1740 has a through-hole 1742 that extends from the one end to the opposite end of the metal tube 1740. The through-hole 1742 is connected with the plurality of fluid channels 1725. For example, the metal tube 1740 may be formed of a material containing zinc (Zn).

In this embodiment, it has been described that the activation members 1700 are installed in the constant-temperature water supply tube 1400 and the constant-temperature water collection tube 1500, respectively. However, the activation member 1700 may be installed in only the constant-temperature water supply tube 1400.

Referring again to FIGS. 2 and 3, a plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked on each other along the vertical direction. The other buffer chambers 3800 are disposed between the transfer chamber 3400 and the interface module 40. Hereinafter, these buffer chambers are referred to as the rear buffers 3804. The rear buffers 3804 are stacked on each other along the vertical direction. The front buffers 3802 and the rear buffers 3804 temporarily store a plurality of substrates W. The substrates W stored in the front buffers 3802 are extracted by the index robot 2200 and the transfer robot 3422. The substrates W stored in the rear buffers 3804 are extracted by the transfer robot 3422 and a first robot 4602.

The developing blocks 30b have heat treatment chambers 3200, a transfer chamber 3400, and liquid treatment chambers 3600. The heat treatment chambers 3200 and the transfer chamber 3400 of the developing blocks 30b are disposed in a structure substantially similar to the structure in which the heat treatment chambers 3200 and the transfer chamber 3400 of the coating blocks 30a are disposed. Therefore, description thereabout will be omitted.

The liquid treatment chambers 3600 in the developing blocks 30b are provided as developing chambers 3600, all of which identically dispense a developing solution to perform a developing process on the substrate W.

Referring again to FIGS. 3 and 4, the interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely processed in the coating blocks 30a is transferred to the exposing apparatus 50, the additional process chamber 4200 may perform a predetermined additional process on the substrate W. Selectively, before the substrate W completely processed in the exposing apparatus 50 is transferred to the developing blocks 30b, the additional process chamber 4200 may perform a predetermined additional process on the substrate W. According to an embodiment, the additional process may be an edge exposing process of exposing an edge area of the substrate W to light, a top-side cleaning process of cleaning the top side of the substrate W, or a back-side cleaning process of cleaning the backside of the substrate W. A plurality of additional process chambers 4200 may be provided. The additional process chambers 4200 may be stacked on each other. The additional process chambers 4200 may all perform the same process. Selectively, some of the additional process chambers 4200 may perform different processes.

The interface buffer 4400 provides a space in which the substrate W transferred between the coating blocks 30a, the additional process chambers 4200, the exposing apparatus 50, and the developing blocks 30b temporarily stays. A plurality of interface buffers 4400 may be provided. The interface buffers 4400 may be stacked on each other.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating blocks 30a, the additional process chambers 4200, the exposing apparatus 50, and the developing blocks 30b. The transfer member 4600 may be implemented with one or more robots. According to an embodiment, the transfer member 4600 has the first robot 4602 and a second robot 4606. The first robot 4602 may transfer the substrate W between the coating blocks 30a, the additional process chambers 4200, and the interface buffers 4400. The second robot 4606 may transfer the substrate W between the interface buffers 4400 and the exposing apparatus 50. The second robot 4606 may transfer the substrate W between the interface buffers 4400 and the developing blocks 30b.

The first robot 4602 and the second robot 4606 each include a hand on which the substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Selectively, the hand of the robot that directly exchanges the substrate W with the transfer plate 3240 of each heat treatment chamber 3200 may have the same shape as the hand 3420 of the transfer robot 3422, and the hands of the remaining robots may have different shapes from the hand 3420 of the transfer robot 3422.

According to an embodiment, the index robot 2200 may directly exchange the substrate W with the heating units 3230 of the front heat treatment chambers 3200 provided in the coating blocks 30a.

Furthermore, the transfer robots 3422 provided in the coating blocks 30a and the developing blocks 30b may directly exchange the substrate W with the transfer plates 3240 located in the heat treatment chambers 3200.

One embodiment of a method for treating a substrate using the above-described substrate treating apparatus 1 will be described below.

Coating process S20, edge exposing process S40, exposing process S60, and developing process S80 are sequentially performed on the substrate W.

Coating process S20 is performed by sequentially performing heat treatment process S21 in the heat treatment chamber 3200, anti-reflection film coating process S22 in the front liquid treatment chamber 3602, heat treatment process S23 in the heat treatment chamber 3200, photoresist film coating process S24 in the rear liquid treatment chamber 3604, and heat treatment process S25 in the heat treatment chamber 3200.

Hereinafter, one example of a transfer path of the substrate W from the carrier 10 to the exposing apparatus 50 will be described.

The index robot 2200 extracts the substrate W from the carrier 10 and transfers the substrate W to the front buffer 3802. The transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. In a state of supporting the substrate W, the transfer plate 3240 is brought into contact with the cooling unit 3220 and performs a cooling process on the substrate W. When the cooling process is completed, the transfer plate 3240 moves above the cooling unit 3220, and the transfer robot 3422 extracts the substrate W from the heat treatment chamber 3200 and transfers the substrate W to the front liquid treatment chamber 3602.

The front liquid treatment chamber 3602 coats the substrate W with an anti-reflection film.

The transfer robot 3422 extracts the substrate W from the front liquid treatment chamber 3602 and places the substrate W in the heat treatment chamber 3200. The heat treatment chamber 3200 sequentially performs the above-described heating and cooling processes. When each heat treatment process is completed, the transfer robot 3422 extracts the substrate W from the heat treatment chamber 3200 and transfers the substrate W to the rear liquid treatment chamber 3604.

Thereafter, the rear liquid treatment chamber 3604 coats the substrate W with a photoresist film.

The transfer robot 3422 extracts the substrate W from the rear liquid treatment chamber 3604 and places the substrate W in the heat treatment chamber 3200. The heat treatment chamber 3200 sequentially performs the above-described heating and cooling processes. When each heat treatment process is completed, the transfer robot 3422 transfers the substrate W to the rear buffer 3804. The first robot 4602 of the interface module 40 extracts the substrate W from the rear buffer 3804 and transfers the substrate W to the additional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the exposing apparatus 50.

Developing process S80 is performed by sequentially performing heat treatment process S81 in the heat treatment chamber 3200, developing process S82 in the liquid treatment chamber 3600, and heat treatment process S83 in the heat treatment chamber 3200.

Hereinafter, one example of a transfer path of the substrate W from the exposing apparatus 50 to the carrier 10 will be described.

The second robot 4606 extracts the substrate W from the exposing apparatus 50 and transfers the substrate W to the interface buffer 4400.

The first robot 4602 extracts the substrate W from the interface buffer 4400 and transfers the substrate W to the rear buffer 3804. The transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the transfer robot 3422.

The developing chamber 3600 performs a developing process by dispensing a developing solution onto the substrate W.

The substrate W is extracted from the developing chamber 3600 and placed in the heat treatment chamber 3200 by the transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the transfer robot 3422.

The index robot 2200 extracts the substrate W from the front buffer 3802 and transfers the substrate W to the carrier 10.

The treating module 30 of the substrate treating apparatus 1 has been described as performing the coating process and the developing process. However, the substrate treating apparatus 1 may include only the index module 20 and the treating module 30 without the interface module 40. In this case, the treating module 30 may perform only the coating process, and a film with which the substrate W is coated may be a spin-on hardmask (SOH) film.

As described above, according to the embodiments, the inventive concept removes dissolved oxygen in constant-temperature water by activating ions in the constant-temperature water. Accordingly, a constant-temperature water tube may be prevented from being corroded.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:

a treatment vessel having a treatment space inside the treatment vessel;

a substrate support unit configured to support the substrate in the treatment space; and a liquid dispensing unit configured to dispense a treatment liquid onto the substrate placed on the substrate support unit, wherein the liquid dispensing unit includes, a treatment liquid tube through which the treatment liquid flows, a constant-temperature water tube through which constant-temperature water flows, the constant-temperature water tube being configured to surround the treatment liquid tube, wherein the constant-temperature water tube is configured to have the constant-temperature water maintain the treatment liquid, which flows through the treatment liquid tube, at a set temperature, a constant-temperature water supply tube configured to supply the constant-temperature water to the constant-temperature water tube, and an activation member installed in the constant-temperature water supply tube and configured to activate ions in the constant-temperature water, the activation of the ions based on friction between the activation member and the constant-temperature water, wherein the constant-temperature water supply tube includes an upstream water supply tube and a downstream water supply tube, and the activation member is detachably between the upstream water supply tube and the downstream water supply tube.

2. The apparatus of claim 1, wherein the ions include H+ and OH—.

3. The apparatus of claim 1, wherein the activation member includes a first organic tube, a second metal tube connectable to the first organic tube, and a third organic tube connectable to the second metal tube.

4. The apparatus of claim 3, wherein the first organic tube is configured to be connected to the second metal tube with a first threaded connected, and the third organic tube is configured to be connected to the second metal tube with a second threaded connection.

5. The apparatus of claim 4, wherein the first organic tube and the third organic tube have female threads, and the second metal tube has male threads.

6. The apparatus of claim 1, wherein the treatment liquid includes a light-sensitive liquid.

7. The apparatus of claim 1, further comprising:
a heater along the constant-temperature water supply tube, the heater configured to heat the constant-temperature water.

8. An apparatus for treating a substrate, the apparatus comprising:
a treatment vessel having a treatment space inside the treatment vessel;
a substrate support unit configured to support the substrate in the treatment space; and
a liquid dispensing unit configured to dispense a treatment liquid onto the substrate placed on the substrate support unit,
wherein the liquid dispensing unit includes,
a treatment liquid tube through which the treatment liquid flows,
a constant-temperature water tube through which constant-temperature water flows, the constant-temperature water tube being configured to surround the treatment liquid tube, wherein the constant-temperature water tube is configured to have the constant-temperature water maintain the treatment liquid, which flows through the treatment liquid tube, at a set temperature,
a constant-temperature water supply tube configured to supply the constant-temperature water to the constant-temperature water tube, and
an activation member installed in the constant-temperature water supply tube and configured to activate ions in the constant-temperature water,
wherein the constant-temperature water supply tube includes,
an upstream-side supply tube configured to connect a constant-temperature water source and the activation member, and
a downstream-side supply tube configured to connect the constant-temperature water tube and the activation member, and
wherein the activation member is detachable from the upstream-side supply tube and the downstream-side supply tube.

9. The apparatus of claim 8, wherein the activation member includes:
a metal tube; and
an organic tube disposed adjacent to the metal tube.

10. The apparatus of claim 9, wherein the organic tube includes:
a first organic tube configured to connect the upstream-side supply tube and one end of the metal tube; and
a second organic tube configured to connect the downstream-side supply tube and an opposite end of the metal tube.

11. The apparatus of claim 10, wherein each of the first organic tube and the second organic tube define a plurality of fluid channels in which the constant-temperature water flows.

12. The apparatus of claim 10, wherein the metal tube includes a material containing zinc, and
wherein each of the first organic tube and the second organic tube includes a material containing carbon.

13. The apparatus of claim 12, wherein the liquid dispensing unit further includes:
a manifold configured to connect the constant-temperature water tube and the constant-temperature water supply tube; and
a constant-temperature water collection tube configured to collect the constant-temperature water from the manifold into the constant-temperature water source.

14. The apparatus of claim 13, wherein the activation member is additionally installed in the constant-temperature water collection tube.

15. The apparatus of claim 9, wherein the organic tube defines a plurality of fluid channels in which the constant-temperature water flows, and
wherein the metal tube defines a single fluid channel which is in fluid communication with the fluid channels.

16. The apparatus of claim 8, wherein the treatment liquid includes a light-sensitive liquid.

17. The apparatus of claim 8, further comprising:
a heater along the constant-temperature water supply tube, the heater configured to heat the constant-temperature water.

* * * * *